(12) United States Patent
Deng

(10) Patent No.: US 9,950,405 B2
(45) Date of Patent: Apr. 24, 2018

(54) CHEMICAL MECHANICAL PLANARIZATION APPARATUS AND METHODS

(71) Applicants: Semiconductor Manufacturing International (Beijing) Corporation, Beijing (CN); Semiconductor Manufacturing International (Shanghai) Corporation, Shanghai (CN)

(72) Inventor: Wufeng Deng, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 9 days.

(21) Appl. No.: 14/445,867

(22) Filed: Jul. 29, 2014

(65) Prior Publication Data
US 2015/0183081 A1    Jul. 2, 2015

(30) Foreign Application Priority Data
Dec. 30, 2013    (CN) .......................... 2013 1 0744276

(51) Int. Cl.
*B24B 37/04*        (2012.01)
*H01L 21/306*     (2006.01)
(Continued)

(52) U.S. Cl.
CPC ............ *B24B 37/04* (2013.01); *B24B 37/044* (2013.01); *B24B 37/046* (2013.01); *B24B 57/02* (2013.01);
(Continued)

(58) Field of Classification Search
USPC ................ 205/48, 222, 640, 642, 643, 644; 156/345.12
See application file for complete search history.

(56) References Cited

U.S. PATENT DOCUMENTS

| | | | |
|---|---|---|---|
| 5,672,263 A * | 9/1997 | Raulerson | B23H 3/02 204/224 M |
| 6,394,882 B1 * | 5/2002 | Chen | B24B 37/30 451/288 |

(Continued)

FOREIGN PATENT DOCUMENTS

| CN | 102601722 A | 7/2012 |
|---|---|---|
| CN | 102623308 A | 8/2012 |

*Primary Examiner* — Sylvia R MacArthur
(74) *Attorney, Agent, or Firm* — Anova Law Group, PLLC

(57) ABSTRACT

A chemical mechanical planarization (CMP) apparatus is provided. The CMP apparatus includes at least one platen; and a polishing pad disposed on the platen. The CMP apparatus also includes a polishing head disposed above the platen and configured to clamp a to-be-polished wafer; and a basic solution supply port disposed above the platen and configured to supply a basic solution onto a surface of the polishing pad. Further, the CMP apparatus includes a slurry arm disposed above the platen and configured to supply a polish slurry on the surface of the polishing pad; and a deionized water supply port configured to supply deionized water onto the surface of the polishing pad. Further, the CMP apparatus also includes a negative power source configured to apply a negative voltage onto the surface of the polishing pad.

19 Claims, 3 Drawing Sheets

(51) Int. Cl.
  *B24B 57/02* (2006.01)
  *H01L 21/321* (2006.01)
  *H01L 21/67* (2006.01)
  *B24B 37/20* (2012.01)
  *B24B 37/24* (2012.01)
  *B23H 3/02* (2006.01)
  *B24D 3/00* (2006.01)
  *H05K 3/07* (2006.01)
  *B23H 7/14* (2006.01)

(52) U.S. Cl.
  CPC ......... *H01L 21/30625* (2013.01); *B23H 3/02* (2013.01); *B23H 7/14* (2013.01); *B24B 37/20* (2013.01); *B24B 37/24* (2013.01); *B24D 3/00* (2013.01); *H01L 21/3212* (2013.01); *H01L 21/32115* (2013.01); *H01L 21/32125* (2013.01); *H01L 21/6715* (2013.01); *H01L 21/67051* (2013.01); *H05K 3/07* (2013.01)

(56) References Cited

U.S. PATENT DOCUMENTS

| | | | |
|---|---|---|---|
| 6,716,089 B2 * | 4/2004 | Sharples | B24B 37/0056 257/E21.228 |
| 6,736,952 B2 * | 5/2004 | Emesh | B23H 5/08 204/212 |
| 6,773,570 B2 * | 8/2004 | Economikos | C25D 5/48 204/212 |
| 7,141,155 B2 * | 11/2006 | Bunyan | B23H 5/08 205/640 |
| 7,790,015 B2 * | 9/2010 | Wang | B23H 5/06 204/228.7 |
| 2003/0084998 A1 * | 5/2003 | Katagiri | B24B 37/245 156/345.12 |
| 2004/0149592 A1 * | 8/2004 | Komai | B23H 5/06 205/663 |
| 2004/0214510 A1 * | 10/2004 | So | B23H 5/08 451/41 |
| 2007/0131562 A1 * | 6/2007 | Wang | B23H 5/08 205/670 |
| 2007/0161338 A1 * | 7/2007 | Fujita | B24B 57/02 451/41 |
| 2008/0188162 A1 * | 8/2008 | Kobata | B23H 5/08 451/8 |
| 2009/0107851 A1 * | 4/2009 | Kodera | B23H 5/08 205/656 |
| 2010/0119811 A1 * | 5/2010 | Feng | B23H 5/08 428/316.6 |
| 2010/0146863 A1 * | 6/2010 | Feng | B24B 37/22 51/296 |
| 2010/0163426 A1 * | 7/2010 | Kiesel | B24B 37/042 205/640 |
| 2010/0216373 A1 * | 8/2010 | Borucki | B24B 37/015 451/6 |
| 2012/0309278 A1 * | 12/2012 | Chen | B24B 37/046 451/444 |
| 2015/0183081 A1 * | 7/2015 | Deng | B24B 37/04 438/693 |

* cited by examiner

CHEMICAL MECHANICAL PLANARIZATION APPARATUS AND METHODS

CROSS-REFERENCES TO RELATED APPLICATIONS

This application claims the priority of Chinese patent application No. 201310744276.6, filed on Dec. 30, 2013, the entirety of which is incorporated herein by reference.

FIELD OF THE INVENTION

The present invention generally relates to the field of semiconductor manufacturing technology and, more particularly, relates to chemical mechanical planarization apparatus and chemical mechanical planarization methods thereof.

BACKGROUND

With the rapid development of ultra large scale integration (ULSI), the fabrication process of integrate circuits (ICs) has become more and more complex; and more and more precise. In order to increase the integration level and lower the production cost, the number of the devices in a unit area has been increasing. Thus, it has been difficult to lay out lines (interconnect structure, etc) in one plane, i.e., two-dimensional layout; and a multiple-layered layout technique has been adapted to utilize the vertical space of the chip (three-dimensional) to further increase the integration level of devices. However, the multiple-layered layout technique may cause the surface of the silicon wafer to be uneven, and it may deteriorate the formation of the patterns, such as devices, and structures, etc. Therefore, in order to achieve the multi-layered layout on a wafer with a relatively large diameter, it may need to obtain an acceptable macroscopic levelness for each layer. That is, the conductors, interlayer dielectric (ILD) layers, metal, silicon oxide and nitrate of the multiple-layered interconnect structures may need to be planarized.

Currently, the chemical mechanical planarization (CMP) process may be a dominant method to achieve the acceptable macroscopic levelness for each layer of the chip. Especially when the semiconductor process enters into the sub-micron regime, the CMP process has become a major process of semiconductor manufacturing. The CMP process utilizes the relative motion between a wafer and a polishing platen to planarize (polishing) the surface of the wafer and/or devices, etc. Further, the CMP process utilizes the combination of chemical force and mechanical forces to achieve the planarization.

FIG. 1 illustrates an existing CMP apparatus.

As shown in FIG. 1, the CMP apparatus includes a platen 100, a polishing pad 102 covering on the platen 100. The CMP apparatus also includes a polishing head 104 configured to clamp a to-be-polished wafer 103; and a clamping fixture 105 configured to carry the polishing head 104 to rotate. Further, the CMP apparatus includes a polishing slurry supply tube 106 configured to provide a polishing slurry for a CMP process.

During the CMP process, the to-be-polished wafer 103 is attached on the polishing head 104. The to-be-polished surface of the wafer 103 faces downwardly; and is pressed by the polishing head 104 to attach on the surface of the polishing pad 102. When the platen 100 is rotated by an electrical motor, the polishing head 104 is also rotated by the clamping fixture 105 with a same direction as the platen 100. At the same time, a polishing slurry 107 is transferred onto the polishing pad 102 by the polishing slurry supply tube 106. With the combinational functions of the polishing head 104, the polishing pad 102 and the platen 100, the polishing slurry 107 are uniformly distributed on the polishing pad 102. During the CMP process, the polishing slurry 107 flows away from the edge of the polishing pad 102 under the centrifuge force.

However, during the CMP process, the CMP apparatus may scratch the to-be-polished wafer; thus it may need further improvements on the performance of the existing CMP apparatus. The disclosed device structures, methods and systems are directed to solve one or more problems set forth above and other problems.

BRIEF SUMMARY OF THE DISCLOSURE

One aspect of the present disclosure includes a chemical mechanical planarization (CMP) apparatus. The CMP apparatus includes at least one platen; and a polishing pad disposed on the platen. The CMP apparatus also includes a polishing head disposed above the platen and configured to clamp a to-be-polished wafer; and a basic solution supply port disposed above the platen and configured to supply a basic solution onto a surface of the polishing pad. Further, the CMP apparatus includes a slurry arm disposed above the platen and configured to supply a polishing slurry onto the surface of the polishing pad; and a deionized water supply port configured to supply deionized water onto the surface of the polishing pad. Further, the CMP apparatus also includes a negative power source configured to apply a negative voltage onto the surface of the polishing pad.

Another aspect of the present disclosure includes a chemical mechanical planarization method. The method includes providing a to-be-polished wafer; and clamping the to-be-polished wafer and pressing the to-be-polished wafer on a surface of a polishing pad using a polishing head. The method also includes rotating the polishing head and the platen and supplying a polishing slurry onto the surface of the polishing pad simultaneously to polish the to-be-polished wafer; and removing the to-be-polished wafer from the polishing pad. Further, the method includes washing the polishing pad by spraying a basic solution.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As a consumable supply of a CMP process, a polishing slurry may have a significantly important effect on the planarization results of the CMP process. The polishing slurry may normally consist of polish particles and chemical additives, etc. A microscopic view of the CMP process may include a chemical process and a physical process. During the chemical process, a chemical reaction may happen between the chemicals in the polishing slurry and the to-be-polished layer on a wafer; and easy-be-removed products may be produced by the chemical reaction. During the physical process, physical scratches may happen between the polishing particles and the to-be-polished layer; and the products from the chemical process may be removed. The polishing particles in the existing polish slurry may be often silicon dioxide particles. The silicon oxide particles in the polishing slurry may have a negative zeta potential, while the polishing pad and the surface of the wafer may have a positive zeta potential, thus the silicon dioxide particles may be absorbed on the polishing pad and the surface of the wafer. It may be difficult to remove the absorbed silicon dioxide particles by de-ionized (DI) water, thus residual silicon oxide particles may be formed on the wafer and the polishing pad after the CMP process. The residual silicon oxide particles on the wafer may affect the performance of the subsequently formed semiconductor devices. Further, the residual silicon oxide particles on the polishing pad may scratch the subsequent to-be-polished wafers. According to the disclosed apparatus and methods, the silicon oxide particle residue issue and other issues may be overcome by using an alkaline solution in the CMP process and/or a negative power source in the CMP apparatus.

Figure 1:
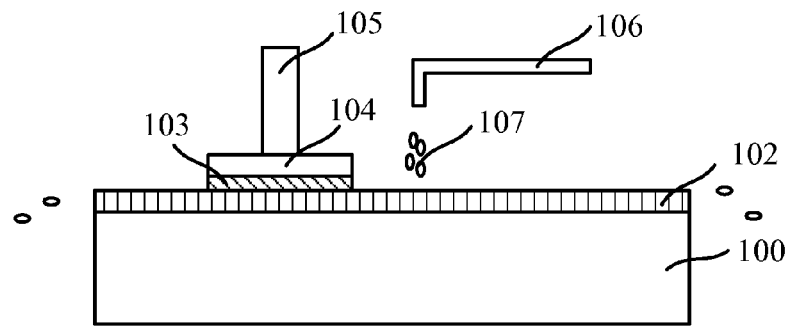
FIG. 1 illustrates an existing CMP apparatus.
Figure 2:
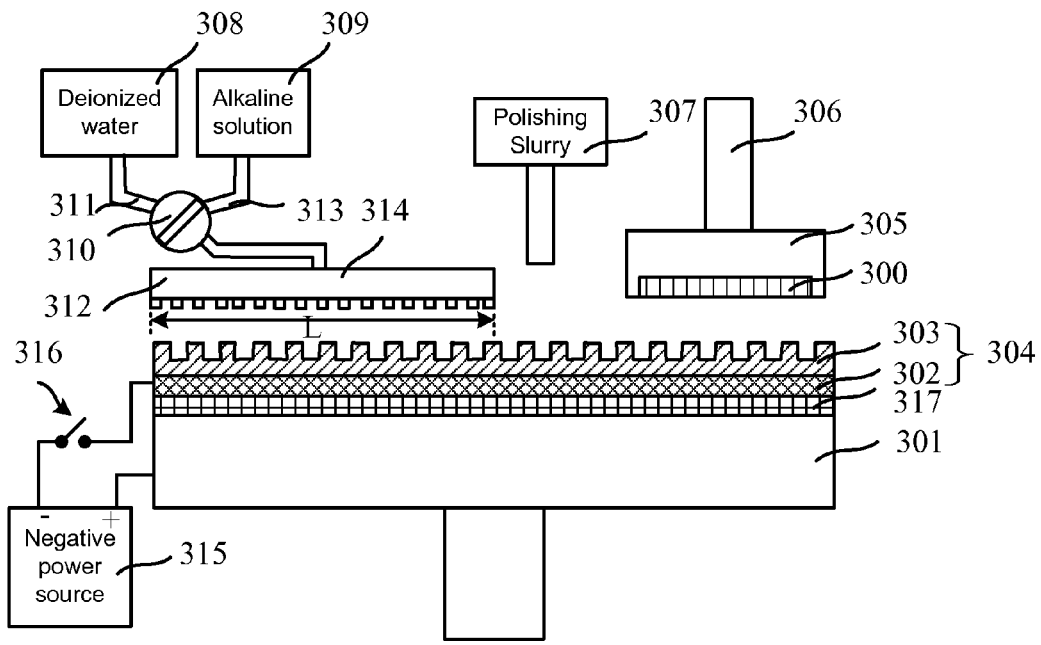
FIG. 2 illustrates an exemplary CMP apparatus consistent with the disclosed embodiments.

FIG. 2 illustrates a CMP apparatus consistent with the disclosed embodiment.

As shown in FIG. 2, the CMP apparatus may include a platen 301 and a polishing pad 304 disposed on the platen 301. The CMP apparatus may also include basic solution supply port 309 disposed above the platen 301 and configured to supply a basic solution onto the surface of the polishing pad 304; and a polishing slurry arm 307 disposed above the platen 301 and configured to supply a polish slurry onto the surface of the polishing pad 304. Further, the CMP apparatus may include a negative power source 315 configured to apply a negative voltage on the polishing pad 304.

Referring to FIG. 2, the polishing pad 304 may include a polishing layer 303 and a metal layer 302 under the polishing layer 303. The polishing layer 303 may be used to polish a to-be-polished wafer. The metal layer 302 may connect with the negative power source 315. When a negative voltage is applied on the metal layer 302 by the negative power source 315, a uniform negative interface potential may be distributed on the surface of the polishing layer 303. Thus, a repulsion may be formed between the surface of the polishing pad 304 having the negative potential and the polishing particles having the negative zeta potential. Such repulsion may prevent the polishing particles from being absorbed on the surface of the polishing layer 303 to form polishing particle residues.

In one embodiment, as shown in FIG. 2, in order to obtain a better polishing result, a plurality of grooves may be formed in the polishing layer 303. The depth of the grooves may be smaller than the thickness of the polishing pad 303. The width of the grooves may be in a range of approximately 0.5 mm~1 mm. When a negative voltage is applied on the metal layer 302 of the polishing pad 304, the negative interface potential on the bottom of the grooves may relatively stronger, thus it may generate stronger electrical repulsion on the polishing particles; and the formation of the residual polishing particles may be prevented. In certain other embodiments, other appropriate patterns may be formed in the polishing layer 303 to prevent the residual polishing particles.

Further, as shown in FIG. 2, an insulation layer 317 may be formed between the polishing pad 304 and the platen 301. When the polishing pad 304 is disposed on the platen 301, the insulation layer 317 may electrically insulate the metal layer 302 of the polishing pad 304 and the platen 301, thus the metal layer 302 may be able to maintain a negative potential.

The insulation layer 317 may be made of any appropriate material. In one embodiment, the insulation layer 317 is made of plastic or epoxy, etc.

Further, referring to FIG. 2, one port of the negative power source 315 may connect with the metal layer 302 of the polishing pad 304; and the other port of the negative power source 315 may connect with the platen 301, or may be grounded. The negative power source 315 may be disposed at any appropriate location of the CMP apparatus. In one embodiment, the negative power source 315 may be disposed in a vacant portion of the platen 301.

Further, referring to FIG. 2, a control switch 316 may be disposed between the negative power source 315 and the metal layer 302. The control switch 316 may be used to control the "on/off" status of the connection between the negative power source 315 and the metal layer 302. When a to-be-polished wafer is being polished, the control switch 316 may turn off the electrical connection between the negative power source 315 and the meal layer 302 to prevent the surface of the polishing pad 304 from having a negative potential. If the surface of the polishing pad 304 has the negative potential during the polishing process, the polishing process may be significantly affected. During a washing process after the polishing process, the control switch 316 may turn on the connection between the negative power source 315 and the metal layer 302, the surface of the metal layer 302 may be negatively charged; and the surface of the polishing pad 304 may have a negative potential. Thus, the negatively charged polishing pad 304 may generate an electrical repulsion onto the polishing particles having the negative zeta potential, and the formation of residual polishing particles may be prevented. Therefore, when the subsequent to-be-polished wafers are being polished, the surfaces of the to-be-polished wafers may not be scratched.

The voltage applied by the negative power source 315 may be any appropriate value. In one embodiment, the applied negative voltage may be in a range of the approximately −25 mV~−5 mV.

In certain other embodiments, if the polishing particles have a positive zeta potential, a positive power source may be used. The positive power source may generate a positive potential on the surface of the polishing pad 304, thus the polish particles having the positive zeta potential may be expelled by the positive potential of the surface of the polishing pad 304; and the formation of residual polishing particles on the polishing pad 304 may be prevented.

Further, referring to FIG. 2, the polishing slurry arm 307 may be used to supply a polishing slurry onto the surface of the polishing pad 304. The polishing slurry arm 307 may be any appropriate shape and structure, such as a single tube, or an array of tubes, etc.

The polishing slurry may contain any appropriate polishing particles, such as silicon dioxide particles, or semiconductor particles, etc. In one embodiment, the polishing particles in the polishing slurry are silicon dioxide particles. Further, the polishing slurry may have any appropriate pH value. In one embodiment, the pH value of the polishing slurry may be in a range of approximately 9~11.

Further, referring to FIG. 2, the basic solution supply port 309 may supply a basic solution onto the surface of the polishing pad 304. The basic solution may be used to increase the pH value of the polishing slurry. The increased pH value of the polishing slurry may increase the repulsion between the polishing particles; and prevent the polishing particles from agglomerating. Further, the increased pH value may also increase the electric repulsion of the polishing pad 304 to the polishing particles. Thus, the polishing particles on the surface of the polish pad 304 may be expelled into a solution; and the formation of the residual polishing particles may be prevented.

The basic solution may be any appropriate solution. In one embodiment, the basic solution is an alkaline solution. For illustrative purposes, an alkaline solution may be used to refer to the basic solution in the description. The pH value of the alkaline solution may be in any appropriate range. In one embodiment, the pH value of the alkaline solution is in a range of approximately 10~12. In certain other embodiments, the pH value of the alkaline solution may be equal to the pH value of the polishing slurry.

Various chemicals may be used to make the alkaline solution, such as diluted ammonia, $NH_4OH$ or KOH, etc. The volume percentile of the diluted ammonia, $NH_4OH$ or KOH in the alkaline solution may be in a range of approximately 20%~40%. As used herein, the volume percentile refers to a ratio between the volume of ammonia, $NH_4OH$, or KOH and the alkaline solution. The alkaline solution may enhance the repulsion of the polishing pad 304 to the polishing particles, thus the formation of the residual polishing particles on the polishing pad 304 may be prevented.

Further, referring to FIG. 2, the CMP apparatus may also include a DI water supply port 308. The DI water supply port 308 may be used to supply DI water onto the surface of the polishing pad 304. The DI water and the alkaline solution may all be used to wash the polishing pad 304; and the polishing pad 304 may not be contaminated. In order to allow the CMP apparatus to have a larger operation space and lower the production cost, in one embodiment, the DI water supply port 308 and the basic solution supply port 309 may connect with spray arm and nozzles 314 by a three-way control valve 310. As shown in FIG. 2, the three-way control valve 310 may have two inlets 311/313 and one outlet 312. The DI water supply port 308 may connect with one of the two inlets 311/313; and the basic solution supply port 309 may connect with the other inlet of the two inlets 311/313. The outlet 312 of the three-way control valve 310 may connect with the spray arm and nozzles 314. The three-way control valve 310 may be used to select the spray arm and nozzles 314 to connect with the DI water supply port 308, or the basic solution supply port 309. When the three-way control valve 310 selects the spray arm and nozzles 314 to connect with the DI water supply port 308, the spray arm and nozzles 314 may spray DI water onto the surface of the polishing pad 304. When the three-way control valve 310 selects the spray arm and nozzles 314 to connect with the basic solution supply port 309, the spray arm and nozzles 314 may spray the basic solution, such as the alkaline solution.

The length "L" of the spray arm and nozzles 314 may be equal to, or greater than the radius of the polishing pad 304. During a cleaning process of the polishing pad 304, when the platen 301 rotates for one cycle, the basic solution may uniformly cover the surface of the polishing pad 304. Further, the repulsion force of the basic solution may also uniformly cover the surface of the polishing pad 304; and it may aid to remove the polishing particles absorbed on the surface of the polishing pad 304.

Further, as shown in FIG. 2, the CMP apparatus may also include a polishing head 305 and a clamping fixture 306. The polishing head 305 may be used to hold a to-be polished wafer 300; and the clamping fixture 306 may be used to drive the polishing head 305 to rotate.

In one embodiment, the basic solution, for example, an alkaline solution may be sprayed onto the surface of the polishing pad 304; and a negative voltage may be applied on the metal layer 302 of the polishing pad 304. The alkaline solution may increase the pH value of the polishing slurry; and increase the repulsion between the polishing particles of the polishing slurry, thus the agglomeration of the polishing particles may be prevented. The alkaline solution may also increase the repulsion of the polishing pad 304 onto the polishing particles, thus the polishing particle may be expelled into a solution; and the formation of the residual polishing particles may be prevented. Further, the metal layer 302 of the polishing pad 304 may connect with the negative power source 315, thus a negative voltage may be uniformly distributed on the surface of the metal layer 302; and a uniform negative potential may be formed on the surface of the polishing layer 303. Such a negative potential may generate an electrical repulsion to the polishing particles with a negative zeta potential, thus the formation of the residual polishing particles on the surface of the polishing pad 304 may be prevented. In one embodiment, providing the alkaline solution and applying a negative voltage may be performed simultaneously, thus the residual and/or the absorbed polishing particles on the surface of the polishing pad 304 may be rapidly and effectively removed; and the performance of the CMP process may be improved.

Figure 3:
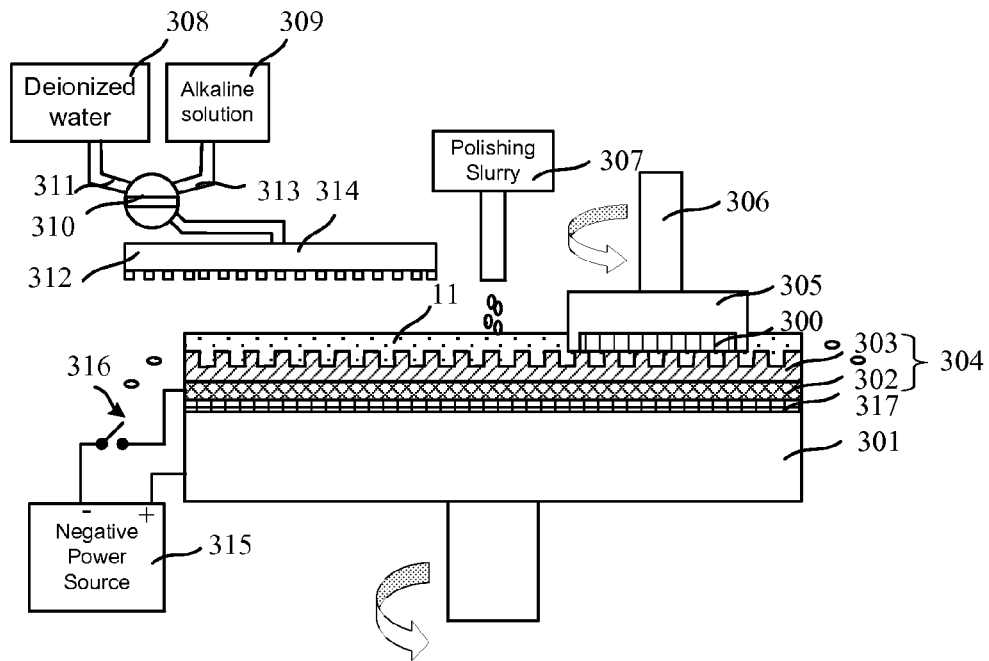
FIGS. 3~5 illustrate certain structures of the exemplary CMP apparatus corresponding to certain stages of an exemplary CMP process consistent with the disclosed embodiments.
Figure 4:
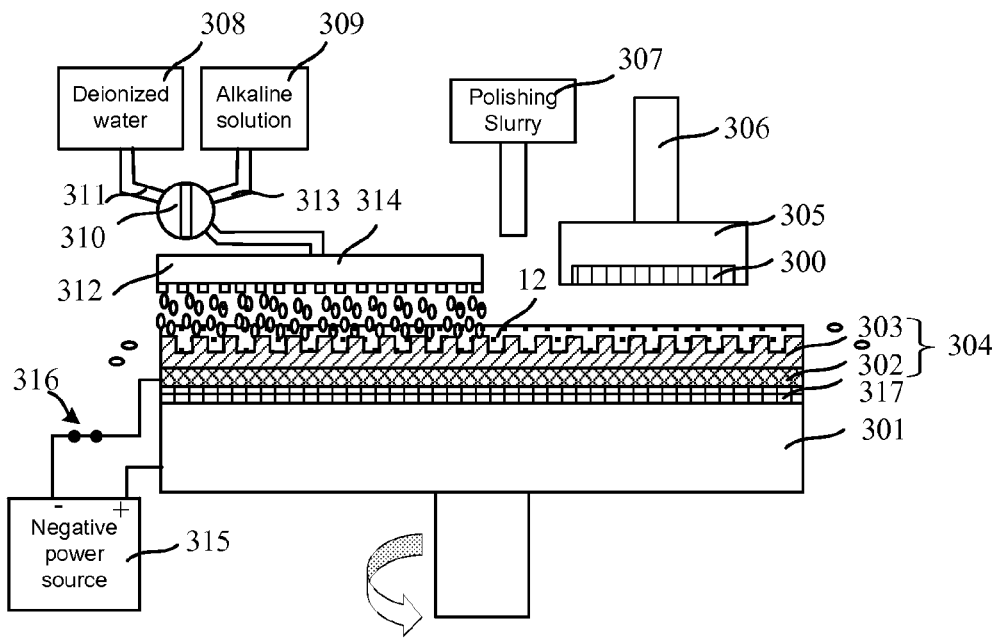
Figure 5:
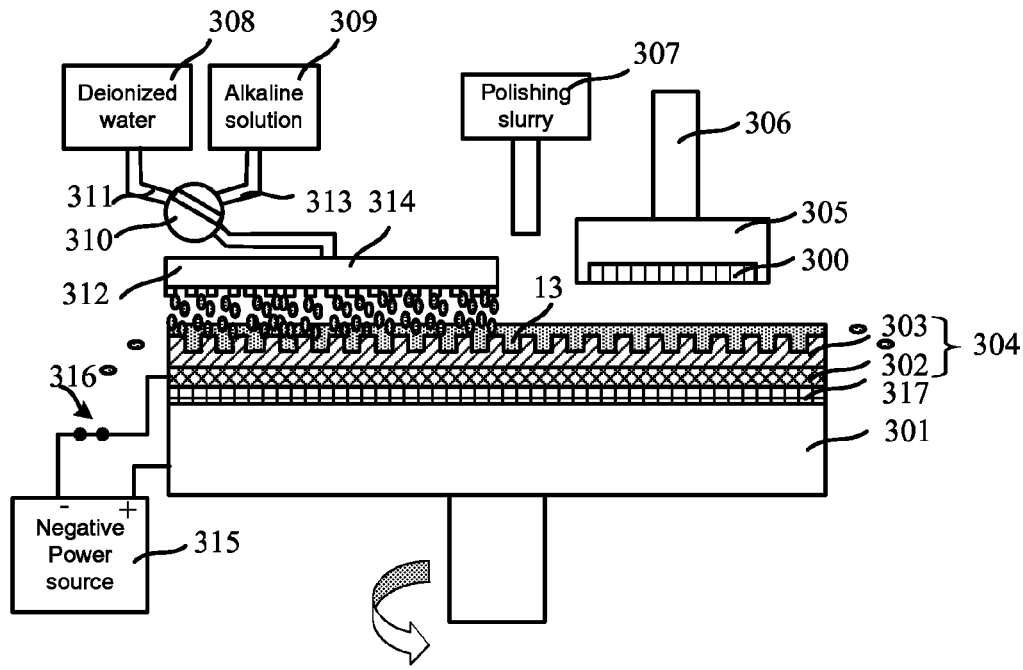
Figure 6:
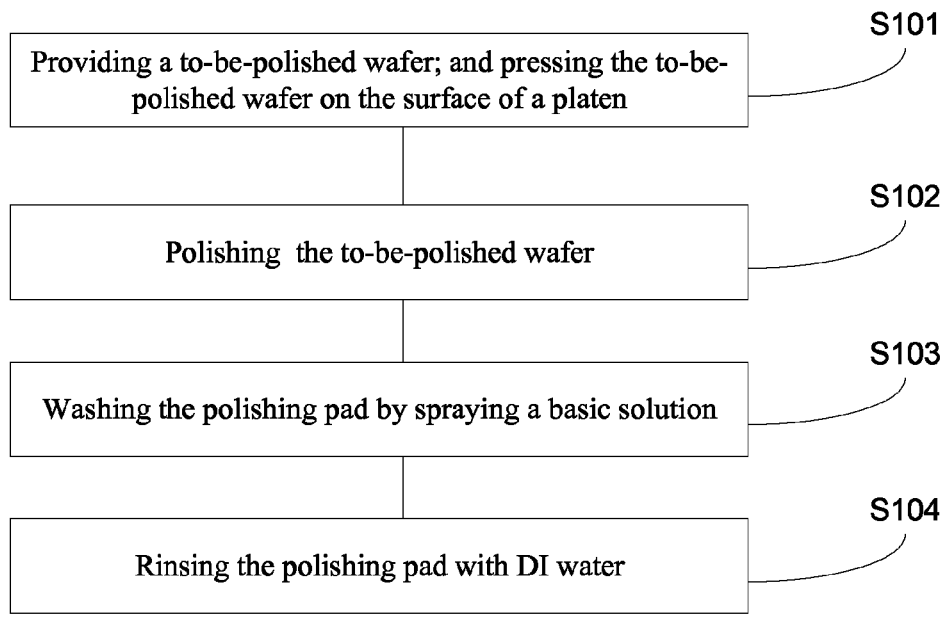
FIG. 6 illustrates an exemplary CMP process consistent with the disclosed embodiments.

FIG. 6 illustrates an exemplary CMP process consistent with the disclosed embodiments; and FIGS. 3~5 illustrate certain structures of the exemplary CMP apparatus corresponding to certain stages of the exemplary CMP process consistent with the disclosed embodiments.

As shown in FIG. 6, at a beginning of the CMP process, a to-be-polished wafer may be provided (S101). FIG. 3 illustrates the structure of a corresponding CMP apparatus.

As shown in FIG. 3, a to-be-polished wafer 300 is provided; and the polishing head 305 may clamp the to-be-polished wafer 300; and press the to-be-polished wafer 300 on the surface of the polishing pad 304 disposed on the surface of the platen 301.

The to-be-polished wafer 300 may be made of any appropriate material, such as Si, Ge, SiGe, SiC, silicon on insulator (SOI), GaAs, or other semiconductor material, etc. In one embodiment, the top surface of the to-be-polished wafer 300 may be the to-be-polished layer (not shown), i.e., a layer will be planarized and/or removed by the CMP process.

In certain other embodiments, the to-be-polished layer (not shown) may be formed on the surface of the to-be-polished wafer 300. The to-be-polished layer may be made of any appropriate material, such as dielectric material, or metals, etc.

Referring to FIG. 3, when the polishing head 305 clamps the to-be-etched wafer 300, the wafer 300 may face downwardly, i.e., the to-be-polished layer 300 contacts with the polishing pad 304. A force for pressing the to-be-polished wafer 300 on the surface of the polishing pad 304 may be in a range of approximately 10 psi~20 psi (pond per square inch).

Further, as shown in FIG. 3, after providing the to-be-polished wafer 300; and clamping the to-be-polished wafer 300, a polishing slurry 11 may be supplied onto the surface of the polishing pad 304; and the polishing head 305 and the platen 301 may be rotated to polish the to-be-polished wafer 300 (S102). A clamping fixture 306 may be used to drive the polishing head 305 to rotate; and an electric motor (not shown) may be used to drive the platen 301 to rotate.

The polishing slurry 11 may contain any appropriate polishing particles. In one embodiment, the polishing particles in the polishing slurry 11 are silicon dioxide particles.

The pH value of the polishing slurry 11 may be in any appropriate range. In one embodiment, the pH value of the polishing slurry 11 is in a range of approximately 9~11.

During the polishing process, a portion of the silicon dioxide particles may be absorbed on the surface of the polishing pad 304. After the polishing process, it may be difficult to directly remove the silicon dioxide particles absorbed on the surface of the polishing pad 304 by DI water. Thus, the residual silicon dioxide particles may be formed. The residual silicon dioxide particles may scratch subsequent to-be-polished wafers. Thus, further steps may need to be performed to completely remove the residual polishing particles.

The process for polishing the to-be-polished wafer 300 may include any appropriate steps. In one embodiment, the process may include a hard pad polishing process and a soft pad polishing process. That is, a hard pad polishing process may be performed firstly; and then a soft pad polishing may be performed. During the hard pad polishing process, the downward force of the polishing head 305 may be in a range of approximately 1 psi~5 psi (pounds per square inch). During the soft pad polishing process, the down force pressure of the polishing head 305 may be in a range of approximately 1 psi~2 psi.

The hard pad polishing process and the soft pad polishing process may be performed on one platen, or multiple platens. In one embodiment, the hard pad polishing process and the soft pad polishing process are performed on different platens.

After finishing the polishing process, the wafer 300 may be cleaned using DI water. In certain other embodiments, the wafer 300 may be subsequently washed during a process for washing the polishing pad 304 using DI water.

When the to-be-polished wafer 300 is being polished, the three-way control valve 310 may be closed, and the control switch 316 may be turned off.

Returning to FIG. 6, after polishing the to-be-polished wafer 300, an alkaline solution may be supplied; and the polishing pad 304 may be washed (S103). FIG. 4 illustrates a corresponding structure of the CMP apparatus.

As shown in FIG. 4, after polishing the to-be-polished wafer 300, the to-be-polished wafer 300 may be moved away from the surface of the polishing pad 304; and then an alkaline solution 12 may be sprayed onto the surface of the polishing pad 304 to wash the polishing pad 304.

After finishing the polishing process of the to-be-polished wafer 300, a washing process may be performed onto the polishing pad 304. The washing process of the polishing pad 304 may include an alkaline solution washing process and a DI water washing process.

During the alkaline solution washing process, the three-way control valve 310 may be switched to the alkaline solution supply port 309; and then the alkaline solution 12 may be supplied onto the surface of the polishing pad 304 through the spray arm and nozzles 314. A portion of the polishing slurry 11 may be left on the surface of the polish pad 304 after polishing the to-be-polished wafer 300. The alkaline solution 12 may increase the pH value of the left polishing slurry 11 on the surface of the polishing pad 304. Thus, the repulsion between the polishing particles in the left polish slurry 11 may be increased; and the agglomeration of the polishing particles may be prevented. Further, the alkaline solution 12 may increase the repulsion of the polishing pad 304 to the polishing particles, thus the polishing particles on the surface of the polishing pad 304 may be expelled into a solution; and it may prevent possible polish particle residues from being formed on the surface of the polishing pad 304.

When the alkaline solution 12 is being sprayed onto the polishing pad 304, the platen 301 may be rotated. At the same time, the control switch 316 may be turned on; and a negative voltage may be applied on the metal layer 302 of the polishing pad 304 by the negative power source 315, thus the surface of the polishing pad 304 may have a uniformly distributed negative potential. The negative potential may cause the surface of the polishing pad 304 to have an electrical repulsion to the polishing particles having a negative zeta potential. Thus, the polishing particle residues on the polishing pad 304 and/or the polishing particles absorbed on the surface of the polishing pad 304 may be rapidly and effectively removed by using a combination of supplying the alkaline solution 12 and applying the negative voltage on the polishing pad 304; and the production time may be reduced.

The pH value of the alkaline solution 12 may be in a range of approximately 10~12. Various chemicals may be used to make the alkaline solution 12, such as ammonia, $NH_4OH$, or KOH, etc. The volume percentile of ammonia, $NH_4OH$, or KOH in the alkaline solution 12 may be in a range of approximately 20%~40%. The pressure for supplying the alkaline solution 12 may be in a range of approximately 10 psi~20 psi. The time for supplying the alkaline solution 12 may be in a range of approximately 5 s~20 s. The rotational speed of the platen 301 may in a range of approximately 60 rpm~110 rpm, such as 80 rpm, 90 rpm, or 100 rpm, etc. The negative voltage may be in a range of approximately −25 mV~−5 mV. Such parameters of the alkaline solution washing process may obtain an optimized result for removing the polishing particles from the surface of the polishing pad 304; and the efficiency of removing the polishing particles may be improved. Therefore, the production time may be significantly reduced.

In one embodiment, the alkaline solution 12 may be supplied after polishing the to-be-polished wafer 300; and the negative voltage may also be applied after polishing the to-be-polished wafer 300. Such a process sequence may prevent the alkaline solution 12 and the negative voltage from deteriorating the properties the polishing slurry 11. Thus, the polishing result of the to-be-polished wafer 300 may not be affected.

Returning to FIG. 6, after washing the polishing pad 304 with the alkaline solution 12 and the negative voltage, the polishing pad 304 may be rinsed by DI water (S104). FIG. 5 illustrates a corresponding structure of the CMP apparatus.

As shown in FIG. 5, after washing the polishing pad 304 with the alkaline solution 12, the three-way control valve 310 may be switched to the DI water supply port 308, thus DI water 13 may be supplied onto the surface of the polishing pad 304 by the spray arm and nozzles 314. At the same time, the platen 301 with polishing pad 304 may keep rotating. Thus, the residual polish particles on the surface of the polishing pad 304 and the alkaline solution 12 on the surface of the polishing pad 304 may be rinsed away by the DI water 13.

The polishing pad 304 may be rinsed by DI wafer 13 for any appropriate time. In one embodiment, the time for rinsing the polishing pad 304 is in a range of approximately 5 s~20 s.

After washing the polishing pad 304 with DI water 13, a subsequent to-be-polished wafer may be polished; and a new CMP process may be started.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A chemical mechanical planarization apparatus, comprising:
   at least one platen;
   a polishing pad disposed on the platen, the polishing pad including a conductive metal layer and a polishing layer on the conductive metal layer;
   an insulation layer between and being directly contacted with the platen and the conductive metal layer of the polishing pad for electrically insulating the platen and the conductive metal layer of the polishing pad;
   a polishing head disposed above the platen and configured to clamp a to-be-polished wafer;
   a basic solution supply port disposed above the platen and configured to supply a basic solution onto a surface of the polishing layer of the polishing pad;
   a slurry arm disposed above the platen and configured to supply a polishing slurry onto the surface of the polishing layer; and
   a deionized water supply port configured to supply deionized water onto the surface of the polishing layer; and
   a power source having a first end physically connected to the platen and a second end physically connected to an edge of the conductive metal layer underlying the polishing layer to apply a voltage between the conductive metal layer and the platen to provide an interface potential to a bottom of the polishing layer through the conductive metal layer, wherein
   the insulation layer is parallel to a top surface of the platen and intervening between the conductive metal layer and the top surface of the platen, and the interface potential is applied to the parallelly arranged conductive metal layer and the platen so that the interface potential is uniformly distributed on the polishing layer through the conductive metal layer.

2. The chemical mechanical planarization apparatus according to claim 1, further including:
   a spray bar and nozzles configured to spray the deionized water or the basic solution onto the surface of the polishing pad; and
   a three-way control valve with one end connecting with the basic solution supply port and the deionized water supply port and the other end connecting with the spray bar and nozzles,
   wherein the three-way control valve is configured to supply either the deionized water or the basic solution without being capable of mixing the deionized water with the basic solution.

3. The chemical mechanical planarization apparatus according to claim 2, wherein:
   a length of the spray bar and nozzles is equal to, or greater than a radius of the polishing pad, and
   the slurry arm is placed between: the polishing head, and the spray bar and nozzles together above the platen.

4. The chemical mechanical planarization apparatus according to claim 1, wherein:
   the basic solution is an alkaline solution; and
   a pH value of the alkaline solution is in a range of approximately 10-12.

5. The chemical mechanical planarization apparatus according to claim 4, wherein:
   the alkaline solution is a diluted ammonia solution, an ammonia hydroxide solution, or a potassium hydroxide solution.

6. The chemical mechanical planarization apparatus according to claim 5, wherein:
   a volume concentration of the diluted ammonia solution, the ammonia hydroxide solution, or the potassium hydroxide solution is in a range of approximately 20%-40%.

7. The chemical mechanical planarization apparatus according to claim 4, wherein:
   a pH value of the polishing slurry is equal to the pH value of the basic solution.

8. The chemical mechanical planarization apparatus according to claim 1, wherein:
   polishing particles in the polishing slurry are silicon dioxide particles; and
   a pH value of the polishing slurry is in a range of approximately 9-11.

9. The chemical mechanical planarization apparatus according to claim 1, wherein:
   the voltage applied on the polishing pad is in a range of approximately about −25 mV to about −5 mV.

10. The chemical mechanical planarization apparatus according to claim 1, wherein:
    a plurality of the grooves are formed in the polishing layer; and
    a thickness of the polishing layer is greater than a depth of the grooves.

11. The chemical mechanical planarization apparatus according to claim 1, further including:
    a control switch, configured to turn off a connection between the power source and the polishing pad when the to-be-polished wafer is being polished; and configured to turn on the connection during a washing process using a basic solution and after polishing the to-be-polished wafer.

12. The chemical mechanical planarization apparatus according to claim 1, wherein: the power source is disposed in a vacant portion of the platen.

13. The chemical mechanical planarization apparatus according to claim 1, wherein:
    the power source includes a positive port directly connected to the platen and a negative port directly connected to the conductive metal layer underlying the polishing layer.

14. A chemical mechanical planarization apparatus, comprising:
- a platen;
- a polishing pad disposed on the platen, the polishing pad comprising:
  - an insulation layer disposed on the platen and directly contacted with the platen;
  - a conductive metal layer disposed on the insulation layer; and
  - a polishing layer disposed on the conductive metal layer, wherein the insulation layer completely covers the platen, the conductive metal layer completely covers the insulation layer, and the insulation layer electrically insulating the platen and the conductive metal layer;
- a power source having a first end physically connected to the platen and a second end physically connected to an edge of the conductive metal layer to apply a voltage between the conductive metal layer and the platen to provide an interface potential to a bottom of the polishing layer through the conductive metal layer, wherein the insulation layer is parallel to a top surface of the platen and intervening between the conductive metal layer and the top surface of the platen, and the interface potential is applied to the parallelly arranged conductive metal layer and the platen so that the interface potential is uniformly distributed on the polishing layer through the conductive metal layer.

15. The chemical mechanical planarization apparatus according to claim 14, further comprising:
- a polishing head disposed above the platen and configured to clamp a to-be-polished wafer;
- a basic solution supply port disposed above the platen and configured to supply a basic solution onto a surface of the polishing layer of the polishing pad;
- a slurry arm disposed above the platen and configured to supply a polishing slurry onto the surface of the polishing layer; and
- a deionized water supply port configured to supply deionized water onto the surface of the polishing layer.

16. The chemical mechanical planarization apparatus according to claim 15, further comprising:
- a spray bar and nozzles configured to spray the deionized water or the basic solution onto the surface of the polishing pad; and
- a three-way control valve with one end connecting with the basic solution supply port and the deionized water supply port and the other end connecting with the spray bar and nozzles,
- wherein the three-way control valve is configured to supply either the deionized water or the basic solution without being capable of mixing the deionized water with the basic solution.

17. The chemical mechanical planarization apparatus according to claim 15, wherein:
- the basic solution is an alkaline solution; and
- a pH value of the alkaline solution is in a range of approximately 10-12.

18. The chemical mechanical planarization apparatus according to claim 15, wherein:
- polishing particles in the polishing slurry are silicon dioxide particles; and
- a pH value of the polishing slurry is in a range of approximately 9-11.

19. The chemical mechanical planarization apparatus according to claim 14, wherein:
- the voltage applied on the polishing pad is in a range of approximately about −25 mV to about −5 mV.

* * * * *